(12) United States Patent
Nurminen (10) Patent No.: US 6,794,930 B1
(45) Date of Patent: Sep. 21, 2004

(54) SIGNAL QUALITY (75) Inventor: Juha Nurminen, Helsinki (FI)

(73) Assignee: Nokia Mobile Phones Ltd., Espoo (FI)

( * ) Notice: Subject to any disclaimer, the term of this patent is extended or adjusted under 35 U.S.C. 154(b) by 7 days.

(21) Appl. No.: 09/716,881

(22) Filed: Nov. 20, 2000

(30) Foreign Application Priority Data

Nov. 26, 1999 (FI) .............................................. 19992540

(51) Int. Cl.⁷ ................................................ H03F 3/38
(52) U.S. Cl. ...................... 330/10; 330/207 P; 330/136
(58) Field of Search ............................... 330/10, 207 P, 330/207 A, 136; 375/238, 239; 327/307

(56) References Cited

U.S. PATENT DOCUMENTS

| | | | | |
|---|---|---|---|---|
| 5,115,205 A | * | 5/1992 | Holmes, Jr. ................... | 330/10 |
| 5,559,467 A | | 9/1996 | Smedley ....................... | 330/10 |
| 5,594,386 A | | 1/1997 | Dhuyvetter .................. | 330/251 |
| 5,675,288 A | * | 10/1997 | Peyrotte et al. ............. | 330/149 |
| 5,898,340 A | | 4/1999 | Chatterjee et al. ........... | 330/251 |
| 6,016,075 A | * | 1/2000 | Hamo ........................... | 330/10 |
| 6,297,692 B1 | * | 10/2001 | Nielsen ......................... | 330/10 |
| 6,373,334 B1 | * | 4/2002 | Melanson ..................... | 330/10 |

FOREIGN PATENT DOCUMENTS

| | | |
|---|---|---|
| DE | 19619208 | 11/1997 |
| WO | WO 98/19391 | 5/1998 |
| WO | WO 98/44626 | 10/1998 |

* cited by examiner

*Primary Examiner*—Henry Choe
(74) *Attorney, Agent, or Firm*—Perman & Green, LLP (57) ABSTRACT

The invention relates to a method for improving the quality of the output signal of especially an audio output stage, which comprises at least a modulator circuit, in such a manner that in accordance with the method a signal generated in the output stage, which signal is proportional to a previous digital input signal, is compared by means of feedback to the digital input signal (IN) of the output stage in order to generate a digital control signal (307), and the operation of said modulator circuit (301) is controlled by means of said digital control signal (307). The invention further relates to an audio output stage which comprises a modulator circuit (301) to modulate a digital input signal (IN), amplifier circuit (302) to amplify a modulated signal, and a filter circuit (303) to filter a modulated and amplified signal, and which audio output stage further comprises a m comparator circuit (305) for comparing the digital input signal (IN) and a signal generated in the output stage, which signal is proportional to a previous digital input signal, and for generating a digital control signal (307) for the modulator circuit (301).

28 Claims, 4 Drawing Sheets

SIGNAL QUALITY

This invention relates in particular to a method for improving the quality of an audio signal. The invention also relates to an output stage with which the quality of an audio signal can be improved. In addition the invention relates to a mobile wireless terminal (also known and hereinafter referred to as mobile station) by means of an arrangement made in which the quality of an audio signal can be improved.

Several different types of amplifier have been developed for audio signal amplification. Audio amplifiers are conventionally classified and the different classes are denoted by letters A, B, AB, C, and D. It is typical of a conventional class A amplifier that it operates in the linear range whereby it is especially advantageously used in audio applications. The drawback of the class A amplifier is that it has a low efficiency for which reason it is seldom used in audio output stages. A class B amplifier has a high efficiency because of the typical push-pull operation, but in order to reduce the crossover distortion a class AB amplifier is almost always required which gives lower efficiency. The class AB amplifier represents a good compromise between the class A and class B amplifiers but it requires that the operating point of the amplifier stage does not drift according to temperature, for example. Therefore, a class C amplifier used in radio-frequency applications uses an operating point that makes the transistor non-conductive in the absence of an input signal, but in order to reduce distortion, resonating circuits are needed at the output. On the other hand, the efficiency and linearity of a class D amplifier are in principle good without operating point adjustment since the output stage acts only as a switch. A class D amplifier becomes fully conductive when an input signal is applied. A typical bridge-connected class D amplifier requires only a third of the operating power of a corresponding class AB amplifier with equal output power and distortion factor. A disadvantage is that the switching frequency of a class D amplifier has to be filtered from the output signal by means of a low-pass filter, but if the switching frequency is high enough the filtering will be simpler. A class D amplifier is typically used to amplify an analog signal, in which case the input signal of the amplifier is analog and the possible feedback signal is also a continuous analog signal. The feedback signal is usually taken from the low-pass filter output. In some recently developed class D output stages, the operation of which is based on pulse width modulation, as disclosed e.g. in the U.S. Pat. No. 5,594,386 (Dhuyvetter), the analog feedback signal is generated by integrating the output pulses prior to possible low-pass filtering. However, the feedback method disclosed does not allow for pulse amplitude variation caused e.g. by fluctuations in the operating voltage and therefore is not able to improve the quality of an audio signal by eliminating the resulting distortion. Thus it would be advantageous to use a class D amplifier directly in the processing of digital audio signals and, especially advantageously, the quality of the signal could be improved at the same time.

In modern mobile stations the digital audio signal is typically first converted into an analog signal, then amplified and only then fed to the loudspeaker. This is, however, impractical as such an arrangement involves a lot of wasted power. It is, indeed, more practical to feed direct to the loudspeakers the analog power generated from the amplified digital signal, whereby the quality of the signal can be improved. Such an arrangement can be achieved with a class D output stage, which means a circuit that comprises at least a class D amplifier to process the signal.

Figure 1:
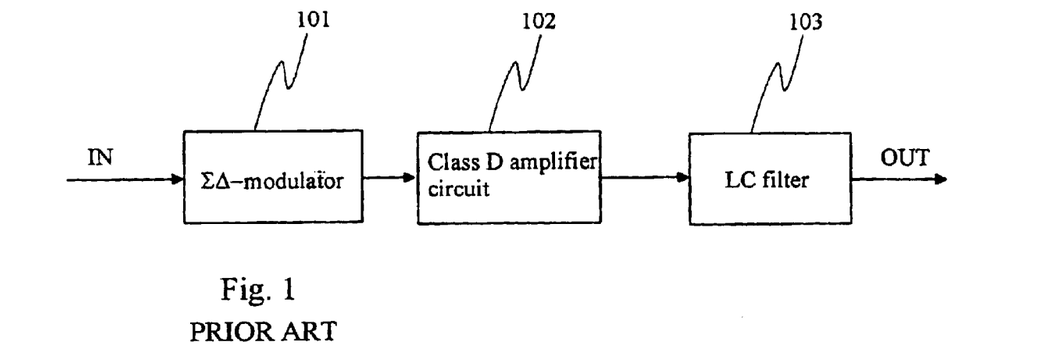
FIG. 1 shows a prior-art class D output stage.

FIG. 1 shows a block diagram of a prior-art class D output stage. The block diagram shown comprises a sigma-delta modulator 101, a class D amplifier circuit 102 and an LC filter 103. In prior-art solutions the digital word at the input IN, which here refers to a set of parallel bits generated from an incoming digital serial or parallel word or pulse-coded message, is fed to the sigma-delta modulator 101 which converts the word fed into the input IN into a pulse train in which the pulse density corresponds to the value of said word fed to the input IN. This pulse train is fed to the class D amplifier circuit 102 which processes the pulse train so as to amplify it in a predetermined manner. For example, pulses indicating high bits may be amplified either to the maximum operating voltage of the amplifier or to ground potential, depending on what has been determined. Pulses indicating low bits are amplified in a corresponding predetermined manner. The amplified pulse train is fed in accordance with the prior art to a low-pass filter, in this case LC filter 103. A driver circuit 102 feeds the signal through the filter 103 direct to a load. By means of the filter 103 it is possible at least partly to remove from the pulse train switching-frequency interference and quantization noise generated in particular in the sigma-delta modulator 101.

The prior-art solutions described above have some disadvantages. First, prior-art solutions are highly susceptible to supply voltage fluctuations. As the supply voltage fluctuates the output audio signal becomes distorted. The distortion is typically of the third order and, additionally, the supply voltage fluctuation results in a noise component that increases the output impedance. Second, the prior-art solutions typically do not have error correction by means of which the disturbances caused by the power stage and external load could be mitigated and removed. If there is error correction, it is based on the use of analog signals. Furthermore, in prior-art solutions the linearity of the output signal of the power stage is not accurate enough for all applications. This is especially problematic in cases in which the supply voltage is unregulated so that it may fluctuate to a great extent.

An object of this invention is to reduce the above-described problems associated with the prior art and to provide an output stage by means of which the quality of an audio signal can be improved.

The objects of the invention are achieved by providing an audio output stage with feedback realized by digital signals, by means of which feedback the quality of a signal can be improved by digitally controlling the operation of a modulating circuit.

The method according to the invention for improving the quality of the output signal of an output stage, which comprises at least a modulator circuit, is characterized in that a signal generated in the output stage, which signal is proportional to a previous digital input signal, is compared by means of feedback to the digital input signal of the output stage in order to generate a digital control signal, and the operation of said modulator circuit is controlled by means of said digital control signal.

The output stage according to the invention for improving the quality of an output signal, which output stage comprises a modulator circuit for modulating a digital input signal,
an amplifier circuit for amplifying the modulated signal,
a filter circuit for filtering the modulated and amplified signal, is characterized in that the output stage further comprises a comparator circuit for comparing the digital input signal and a signal generated in the output stage, which signal is proportional to a previous digital input signal, and for generating a digital control signal for the modulator circuit.

The mobile station according to the invention, which mobile station comprises an output stage for processing a received audio signal, is characterized in that the output stage in the mobile station comprises a first means to modulate a digital signal, a second means to amplify a modulated signal, a third means to filter a modulated and amplified signal, a fourth means to generate a digital control signal by comparing the input signal to a signal generated in the output stage, which signal is proportional to a previous digital input signal, and by processing the signal which is the result of the comparison in such a manner that it is converted into a digital control signal suitable for the first means.

Advantageous embodiments of the invention are presented in the dependent claims.

In the arrangement according to the invention feedback is arranged at the output stage. By means of the feedback it is possible to improve the quality of the output signal of the output stage. The output stage advantageously comprises a modulator circuit, amplifier circuit, filter circuit and a comparator circuit. The input signal is modulated, after which the signal is amplified and filtered. Advantageously the output signal of the amplifier circuit is brought by the feedback to the comparator circuit where the signal is compared to the current input signal of the output stage. In accordance with a second arrangement the feedback is taken from the filter circuit output. On the basis of said comparison a difference signal is advantageously generated and then processed so as to provide a control signal suitable for the modulator circuit. The control signal is used to change the settings in the modulator circuit, whereby errors generated in the processing of the previous input signal are taken into account in the modulation of the input signal. Said feedback signal is made digital for the modulator circuit.

The invention will now be described in more detail with reference to the accompanying drawings wherein

Like elements in the figures are denoted by like reference designators. FIG. 1 was discussed above in connection with the description of the prior art.

Figure 2:
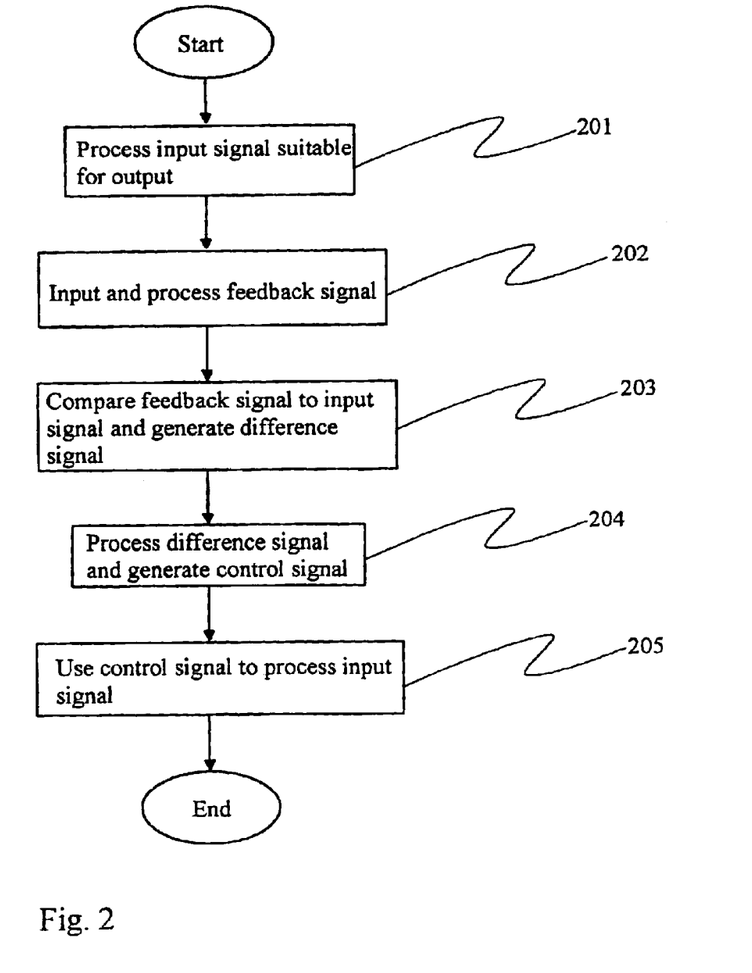
FIG. 2 shows a flow diagram of the method according to the invention.

FIG. 2 shows a flow diagram of the method according to the invention. In accordance with the method, a digital input signal is processed 201 in the first step so as to be suitable for the output means. The input signal may be e.g. a digital word or pulse-coded message which is converted e.g. by means of pulse width modulation into a bit stream. In addition, the input signal may be inverted and amplified, for example. Furthermore, the signal may be filtered in connection with the processing. At an advantageous point, say after the amplification, the processed input signal is sampled, thus obtaining a feedback signal 202 which is advantageously processed e.g. by filtering in such a manner that the bandwidth of the feedback signal corresponds to the bandwidth of the original input signal. The feedback may also be taken after the filtering. The processed feedback signal is compared to the input signal and on the basis of the comparison a difference signal is generated 203. The comparison is performed advantageously more than once for every input signal word since in the arrangement according to the invention the sampling frequency of the feedback signal is advantageously higher than the updating frequency of the input word. Advantageously the difference signal is processed in such a manner that the rate and direction of change of the difference signal can be determined. This can be realized e.g. by first integrating and then differentiating said feedback signal. Said information about the rate and direction of change of the difference signal is advantageously used for estimating and predicting the difference signal, whereby a control signal is generated by modifying the value of the difference signal on the basis of the rate and direction of change of the difference signal, 204. The control signal is used in the next step 205 in the processing of the input signal in such a manner that it is used to control the units processing the input signal. It is obvious to a person skilled in the art that in the method according to the invention the control signal is used in an attempt to remove the errors generated in the input signal during the processing by comparing the feedback signal time and again to the instantaneous input signal. So, by controlling at least one processing unit it is thus possible to compensate for an error in the output signal. It is obvious to one skilled in the art that from the temporal point of view the control signal is generated from the value of a signal that is prior to the signal affected by the control signal. Thus, in a way, the method according to the invention predicts the development of the difference signal error during the generation of the control signal and corrects it as quickly as possible by means of said control signal, but using a control signal value such that the feedback will not result in self-oscillation.

Figure 3A:
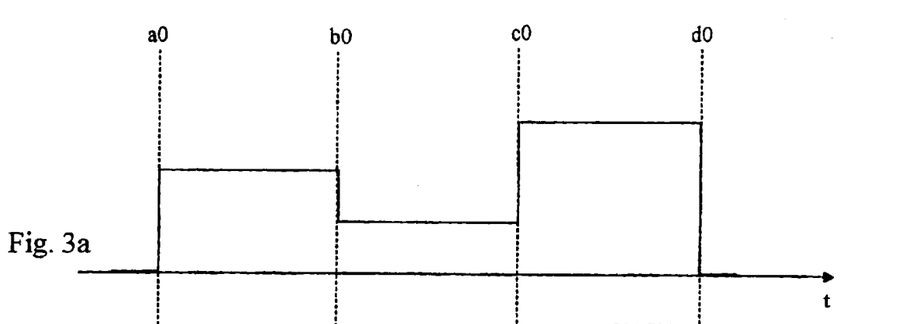
FIG. 3a shows an input signal.
Figure 3B:
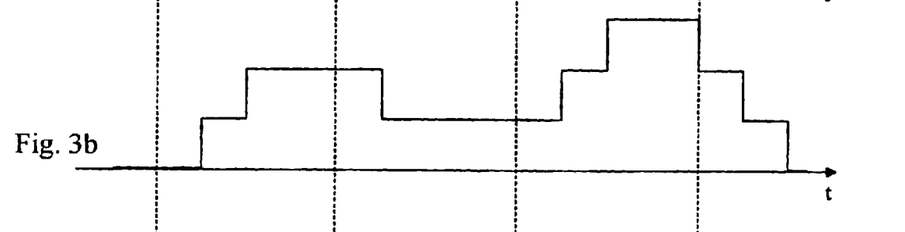
FIG. 3b shows a feedback signal.
Figure 3C:
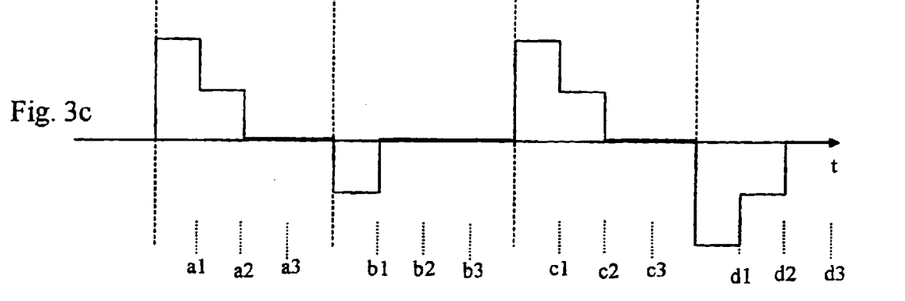
FIG. 3c shows a difference signal before processing.

It is obvious to a person skilled in the art that since the feedback signal is updated more frequently than the input word, reference points can be created in between the input word changing points. This is illustrated in FIGS. 3a to 3c which schematically show the development of the input signal, feedback signal and difference signal in the case of an open loop. FIG. 3a shows the update points a0, b0, c0, d0 of a digital input signal, such as a digital input word. Correspondingly, FIG. 3b shows the update points a1, a2, b1, c1, c2, d0, d1, d2 of the feedback signal, which is updated more frequently than the input signal. FIG. 3c shows the development of the difference signal in the case of an open loop. In practice, i.e. in the case of a closed loop, the general amplitude of the difference signal is naturally significantly smaller as it is just the purpose of the feedback to minimize the difference signal. It is obvious to one skilled in the art that the signals shown in FIGS. 3a to 3c are not directly connected with any particular embodiment of the invention but are shown here just for the purpose of illustrating the invention.

Advantageously the signals described above are in sampled form in the memory of a digital signal processor or the like, and the necessary filtering and processing and the comparison in order to generate the difference signal as well as the processing of the difference signal are realized in software in a digital signal processor.

In a method according to the invention the difference signal is used to change at least one reference level in the converting circuit. By changing the reference level it is possible to avoid extra delays, whereby the output signal error can be corrected faster. Then also the difference signal determined will better represent the current input signal. The idea in the method according to the invention is that e.g. in a case where the output signal value is greater than the input signal value, a negative difference signal is generated. This negative difference signal is e.g. summed to the reference level of the converting circuit, thus making said reference level lower. By reference level it is meant here the level in the converting circuit at which the converting circuit interprets the input signal value as one. As the reference level decreases the reference level is reached with a lower input signal value, whereby the output signal value decreases and, hence, the difference signal decreases, too. If, on the other hand, the output signal value is smaller than the input signal value, the reference level is increased, whereby the output signal value increases and the difference signal decreases. It is obvious to a person skilled in the art that the changing of the reference level may be arranged in some other manner than what is described.

Figure 4:
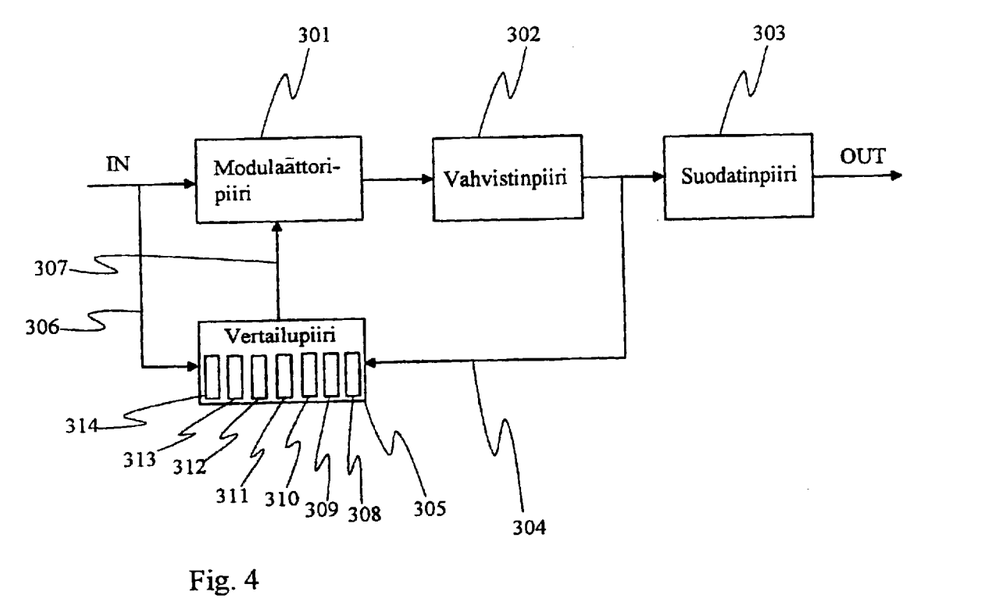
FIG. 4 shows a first class D output stage according to the invention.

FIG. 4 shows an output stage block diagram according to a first embodiment of the invention. The output stage comprises at least a modulator circuit 301, amplifier circuit 302, filter circuit 303 and comparator circuit 305. The input signal IN is arranged so as to be fed to the modulator circuit 301. In this exemplary embodiment the input signal IN is a numerical value represented by a digital word. The width of the word may be freely chosen according to the requirements of the particular applications. The modulator circuit 301 is e.g. a sigma-delta converter by means of which the digital word can be converted, using e.g. pulse density modulation, into a pulse train, the pulse values being determined on the basis of the pulse density. As known, the sigma-delta converter has an internal reference level on the basis of which the converter determines the output bit value. The output signal, or the pulse train, from the modulator 301 is taken to the amplifier circuit 302, which in this exemplary embodiment is a class D amplifier. The amplifier circuit 302 amplifies the signal e.g. in such a manner that it raises the voltage level of the pulses indicating a one, i.e. the more dense pulse train, for example, to the supply voltage of the amplifier circuit 302, and drops the pulse density indicating a zero to ground potential. It is obvious to one skilled in the art that the voltage levels representing the pulse densities may also be chosen otherwise. The output signal from the amplifier circuit 302 is a pulsed analog signal which, when suitably filtered in the filter circuit 303, can be fed to the output means, such as e.g. loudspeakers in the case of an audio signal. Filtering can be carried out using e.g. a low-pass filter implemented with an LC circuit.

The exemplary embodiment shown in FIG. 4 has a feedback loop in which the feedback signal 304 is taken from the output of the amplifier circuit 302. The feedback signal 304 is fed to the comparator circuit 305. The feedback signal 304 is filtered in such a manner that operations in the comparator circuit 305 are carried out only on signal frequencies corresponding to the input signal IN. The comparator circuit 305 comprises a first means 314 to filter said feedback signal 304, which is analog, to a frequency range corresponding to the input signal. The comparator circuit 305 comprises a second means 308 to convert the filtered analog signal into a digital signal. Advantageously said means 308 is an A/D converter, for example. The comparator circuit further comprises a means 309 with which bits can be added to said digital signal so as to make it correspond to the input signal regarding the number of bits. A sample signal 306 is taken into the comparator circuit 305 from the current input signal IN. Advantageously the comparator circuit 305 comprises a means 310 to synchronize the feedback signal with the output stage input signal IN. It is obvious to a person skilled in the art that advantageously the number of bits in the sample signal 306 corresponds to the bit width of one input word. The comparator circuit 305 advantageously comprises a means 311 to compare the values of the sample signal 306 and feedback signal 304 so that a difference signal is generated as a result of that comparison. The comparator circuit 305 further comprises a means 312 to process, e.g. by means of integration and differentiation, the difference signal, so that these operations yield the rate and direction of change of the difference signal at that moment. By comparing this to the results of earlier differentiations it is possible to determine the direction of change of the difference signal for a longer period of time. The comparator circuit 305 also comprises a means 313 to change the processed difference signal into a control signal 307 suitable for the modulator circuit 301. Advantageously the value of the control signal 307 is based on the difference signal change information obtained from the processing. By means of the control signal 307 the reference levels of the modulator circuit 301 can be processed such that the output signal of the amplifier circuit 302 better represents the input signal IN. It is obvious to one skilled in the art that the arrangement according to the invention can be used to predict the rate and direction of change of the difference signal. Thus the difference signal is used so as to make the output signal follow the input signal, whereby errors caused by signal modulations and amplifications can be reduced.

Figure 5:
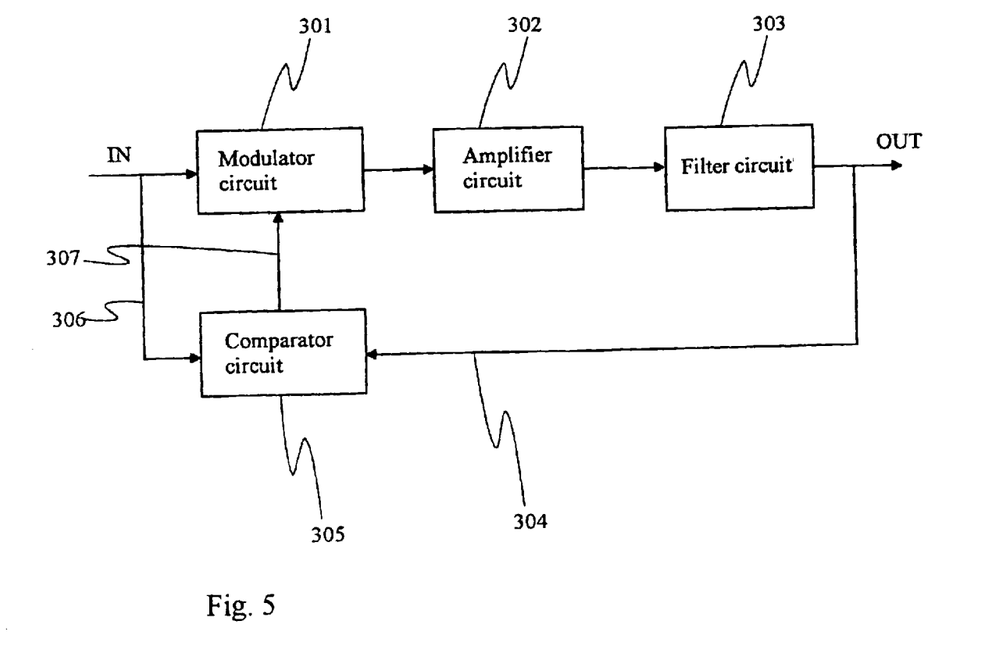
FIG. 5 shows another class D output stage according to the invention.

FIG. 5 shows a second advantageous embodiment of the invention. In this embodiment the class D output stage comprises a modulator circuit 301, amplifier circuit 302, filter circuit 303 and a comparator circuit 305. The input signal IN is processed in this exemplary embodiment in the same way as in the arrangement according to FIG. 4. In the first step the input signal IN is modulated e.g. by means of pulse density modulation into a pulse train in which the pulse density represents the input bit 30 value. Such modulation can be realized e.g. with a sigma-delta converter having an internal reference level on the basis of which the input signal value is converted into a pulse train. The output of the modulator circuit 301 is taken to the amplifier circuit 302, which may comprise a class D amplifier, for example. In the amplifier circuit 302 the pulses in the pulse train are amplified e.g. in such a manner that the voltage level of the pulses in a dense pulse train is increased to the supply voltage of the amplifier circuit 302 and the level of the other pulses is dropped to ground potential. It is obvious to one skilled in the art that the pulse train amplification may also be arranged in some other way. The output from the amplifier circuit 302 is further taken to the filter circuit 303 where the signal is suitably filtered for the output means. Advantageously filtering removes at least partly quantization noise from the signal. In this embodiment the feedback signal 304 is taken from the output of the filter circuit 303. In this exemplary embodiment the feedback signal 304 is filtered so as to correspond to the frequency range of the input signal IN. In the next step, the filtered feedback signal is A/D-converted, and a necessary number of bits is added to the result of the A/D conversion so that it can be compared to the input signal IN of which a sample signal 306 has been taken for the comparison. On the basis of the comparison a difference signal is generated and then differentiated in order to give the rate and direction of change of the difference signal. The difference signal is processed at least on the basis of current change information. Change information of earlier difference signals may also be utilized in the processing. The processed difference signal is taken to the modulator circuit 301 in which the internal reference levels of the circuit, such as a sigma-delta modulator, can be changed on the basis of the processed difference signal. It is obvious to a person skilled in the art that the comparator circuit 305 in FIG. 5 comprises the same elements as the comparator circuit shown in FIG. 4. For simplicity, these elements are not shown in FIG. 5.

The modulator circuit 101 described above is arranged so as to realize pulse density modulation on the input signal. It is obvious to one skilled in the art that the modulator circuit 101 may also utilize modulation methods that can be applied in an arrangement according to the invention. One such modulation method is pulse width modulation. Of the various pulse width modulation methods it is possible to choose e.g. a method in which the pulse width is increased symmetrically in time from the pulse center point, or a method in which the pulse width is increased only in one temporal direction.

Figure 6:
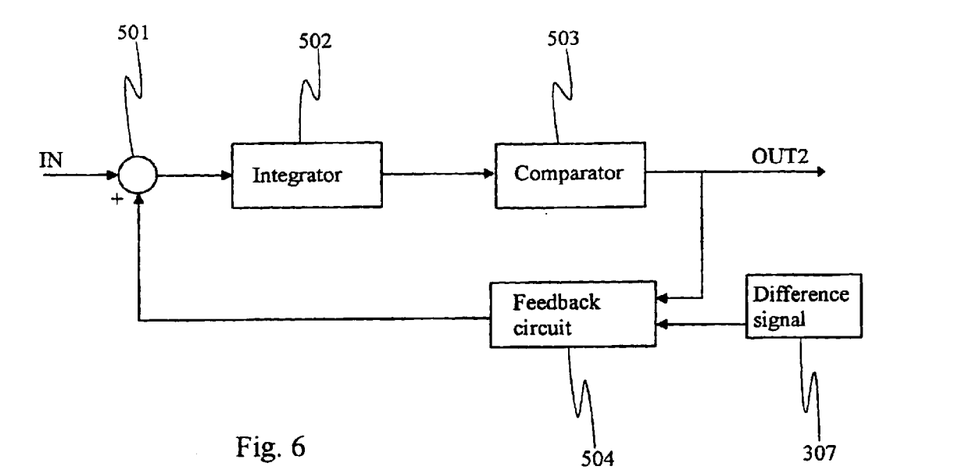
FIG. 6 shows a sigma-delta modulator according to the invention.

FIG. 6 shows a modulator circuit 301 according to the invention. An input signal IN is fed via a summing element 501 to an integrator 502. In the integrator the input signal IN is integrated and the integrated signal is then used to generate by means of a comparator 503 a pulsed signal which is output from the modulator circuit 301 as an output signal OUT2. The output signal OUT2 is taken to a feedback circuit 504. Also a processed difference signal generated in the comparator circuit 305 is given as a control signal to the feedback circuit 504. According to an advantageous embodiment of the invention the output signal OUT2 and the processed difference signal are summed together into a signal to be amplified. Other arrangements, too, are possible. The feedback circuit 504 is used to generate a signal that is summed to the input signal IN of the modulator circuit 301 in the summing element 501. This way it is possible to reduce errors caused by modulation in the output of the modulator circuit 301 and, thereby, improve the operation of the whole output stage.

It is obvious to a person skilled in the art that delays can be advantageously reduced by processing the reference levels in the modulator circuit 301 by means of a control signal. This is a markedly faster solution than one in which the difference signal is added direct to the input signal because in this solution the difference signal and hence the control signal is updated more often than the input signal. The lengths of delays can also be affected by carefully selecting the point from which the feedback signal is taken.

Figure 7:
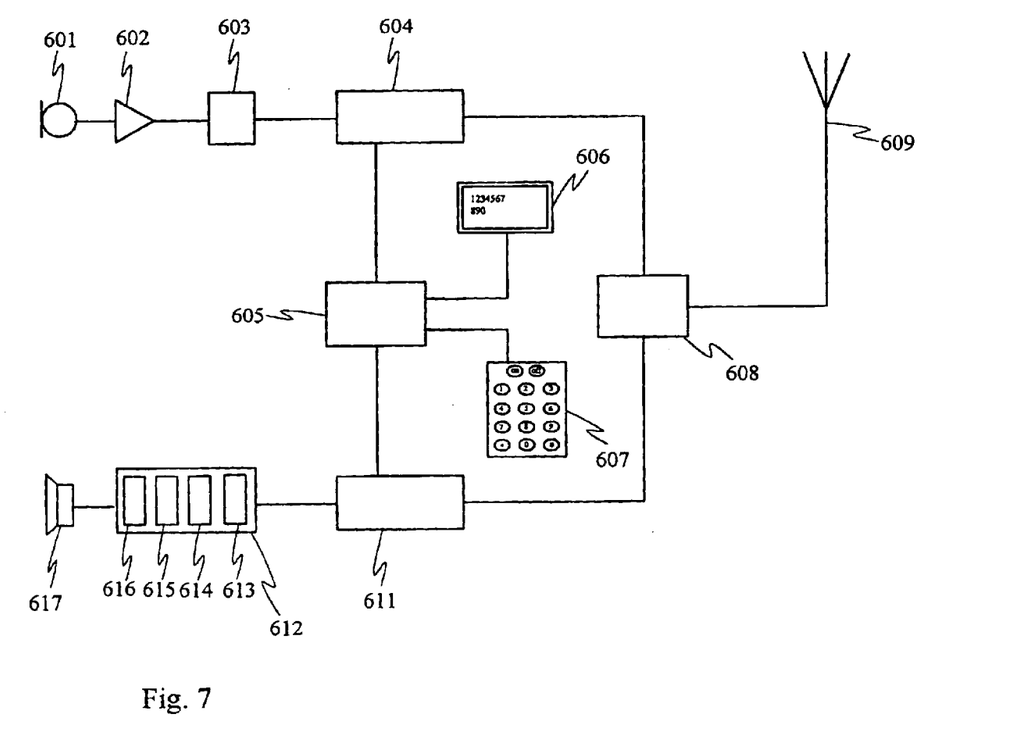
FIG. 7 shows a mobile station according to the invention.

FIG. 7 shows a block diagram of a mobile station according to an exemplary embodiment of the invention, in which the solution according to the invention is applied. The mobile station comprises typical parts, such as a microphone 601, keypad 607, display 606, earphone 617, transmit/receive switch 608, antenna 609, and a control unit 605. Additionally, the figure shows transmitter and receiver blocks 604, 611 typical of a mobile station. The transmitter block 604 comprises functions needed in speech encoding, channel encoding, encryption and modulation as well as the RF functions. The receiver block 611 comprises the corresponding RF functions as well as the functions needed in demodulation, decryption, channel decoding and speech decoding. A signal coming from the microphone 601, amplified in an amplifier stage 602 and converted to digital form in an A/D converter, is taken to the transmitter block 604, typically to a speech encoding element in the transmitter block. Having been processed, modulated and amplified in the transmitter block the signal is taken via the transmit/receive switch 608 to the antenna 609. A received signal is brought from the antenna via the transmit/receive switch 608 to the receiver block 611 which demodulates, decrypts and channel decodes the received signal. In a mobile station according to the invention the signal is taken from the receiver block 611 to the output stage 612. In stereo and 3D sound applications the output stage may be multiplied, but this does not affect the principle of the invention. The output stage 612 comprises a first means 613 to modulate a signal using pulse density modulation, for example. Such a means may be realized with a digital sigma-delta modulator, for instance. The output stage 612 of the mobile station further comprises a second means 614 to amplify the modulated signal. Such a means 614 may comprise a class D amplifier circuit, for example. The amplified signal is filtered using a third means 615, say a low-pass filter. The mobile station according to the invention also comprises a means 616 to realize control for the modulation in the first means 613. The magnitude of the control signal 307 is determined in a comparator circuit 305 the feedback signal of which is in a first embodiment taken from the output of the second means 614. In a second advantageous embodiment the feedback is taken from the output of the third means 615. Advantageously the input signal of the output stage 612 is also used to determine the control signal 307. By comparing the input signal and feedback signal and by suitably processing the result of the comparison a digital control signal 307 for the first means 613 is advantageously generated with which the operation of the first means can be improved. The output signal of the output stage 612 is further taken to the earphone 617. The control unit 605 controls the operation of the mobile station, reads commands entered by the user on the keypad 607 and sends messages to the user through the display 606.

It is obvious to a person skilled in the art that the solution according to the invention finds particular utility in digital mobile communication systems such as GSM (Global System for Mobile communications). The invention may also be applied in future digital mobile communication systems such as UMTS (Universal Mobile Telecommunication System).

It is obvious to one skilled in the art that the solution according to the invention finds particular utility in digital loudspeakers, too, because in such loudspeakers the input signal is a serial digital word and the amplifier proper is located in the loudspeaker so that the usual filter can be advantageously left out. In such an application the both embodiments of the invention take the feedback from the same point.

In the modulator circuit, signal modulation may be realized with modulation methods other than pulse density modulation as far as they are applicable in the solution according to the invention. One such method is pulse width modulation.

It is obvious to a person skilled in the art that in a solution according to the invention in which the feedback signal directly affects the modulator reference levels it is possible to have the advantage that possible supply voltage fluctuations in the output stage can be compensated for. Delays in the circuit can also be reduced with the solution according to the invention.

The invention is not limited solely to the embodiments described above but the inventional idea disclosed here may be applied within the scope of the inventional idea defined by the claims attached hereto.

What is claimed is:

1. A method for improving the quality of the output signal of an audio output stage, which comprises at least a modulator circuit (301), characterized in that a signal generated in the audio output stage, which signal is proportional to a previous digital input signal, is compared by means of feedback to the digital input signal (IN) of the audio output stage in order to generate a digital control signal (307) and wherein the feedback takes place at a higher rate than the digital input signal, and the operation of said modulator circuit (301) is controlled by means of said digital control signal (307).

2. The method according to claim 1, characterized in that the digital control signal (307) is used to change at least one reference level in the modulator circuit (301) of the audio output stage.

3. The method according to claim 1, characterized in that said signal generated in the audio output stage proportional to a previous digital input signal is filtered so as to correspond to the frequencies of the digital input signal in order to realize said comparison in the feedback.

4. The method according to claim 3, characterized in that in the feedback circuit bits are added to the filtered signal proportional to a previous digital input signal so that said signal will correspond to the digital input signal (IN) as regards the number of bits.

5. The method according to claim 1, characterized in that in the feedback circuit, the signal proportional to the previous digital input signal is synchronized with the clock frequency of the input signal (IN).

6. The method according to claim 1, characterized in that said digital control signal is generated more often than said digital input signal changes.

7. A method for improving the quality of the output signal of an audio output stage, which comprises at least a modulator circuit (301), wherein:

a signal generated in the audio output stage, which signal is proportional to a previous digital input signal, is compared by means of feedback to the digital input signal (IN) of the audio output stage in order to generate a digital control signal (307), the operation of said modulator circuit (301) is controlled by means of said digital control signal (307), a digital input signal brought to the output stage is converted into a pulse train by means of modulation, said pulse train is amplified, said pulse train is filtered in the feedback circuit to a frequency range corresponding to the input signal, the filtered pulse train is converted into a digital signal in the feedback circuit, bits are added to said digital signal so that it corresponds to the input digital word as regards the number of bits, said input digital word and said digital signal are compared so as to produce a difference signal, change data for the digital difference signal are determined, and on the basis of said change data the conversion of the input digital word of the output stage into a pulse train is controlled by means of the digital control signal (307).

8. A method for improving the quality of the output signal of an audio output stage, which comprises at least a modulator circuit (301), wherein:

a signal generated in the audio output stage, which signal is proportional to a previous digital input signal, is compared by means of feedback to the digital input signal (IN) of the audio output stage in order to generate a digital control signal (307), the operation of said modulator circuit (301) is controlled by means of said digital control signal (307), a digital input word brought to the output stage is converted into a pulse train by means of modulation, said pulse train is amplified, said pulse train is filtered so as to make it suitable for output means, said pulse train filtered suitable for the output means is filtered in the feedback circuit to a frequency range corresponding to the input signal, the filtered pulse train is converted into a digital signal in the feedback circuit, bits are added to said digital signal so that it corresponds to the input digital word as regards the number of bits, said input digital word and said digital signal are compared so as to produce a difference signal, change data for the digital difference signal are determined, and on the basis of said change data the conversion of the input digital word of the output stage into a pulse train is controlled by means of the digital control signal (307).

9. The method according to claim 7, characterized in that the modulation is performed using pulse density modulation.

10. The method according to claim 7, characterized in that the modulation is performed using pulse width modulation.

11. An audio output stage for improving the quality of an output signal, which audio output stage comprises a modulator circuit (301) for modulating a digital input signal (IN), an amplifier circuit (302) for amplifying the modulated signal, a filter circuit (303) for filtering the modulated and amplified signal, characterized in that the audio output stage further comprises a comparator circuit (305) for comparing the digital input signal (IN) and a signal generated in the output stage, which signal is proportional to a previous digital input signal, and for generating a digital control signal (307) for the modulator circuit (301) wherein the signal generated in the output stage updated at a higher rate than the digital input signal.

12. The audio output stage according to claim 11, characterized in that the signal generated in the audio output stage is brought to the comparator circuit (305) from the output of the amplifier circuit (302).

13. The audio output stage according to claim 11, characterized in that the signal generated in the audio output stage is brought to the comparator circuit (305) from the output of the filter circuit (303).

14. The audio output stage according to claim 11, characterized in that said modulator circuit (301) is a sigma-delta converter.

15. The audio output stage according to claim 11, characterized in that said amplifier circuit (302) is a class D amplifier.

16. The audio output stage according to claim 11, characterized in that said filter circuit (303) is a low-pass filter.

17. An audio output stage for improving the quality of an output signal, which audio output stage comprises a modulator circuit (301) for modulating a digital input signal (IN), an amplifier circuit (302) for amplifying the modulated signal, a filter circuit (303) for filtering the modulated and amplified signal, characterized in that the audio output stage further comprises a comparator circuit (305) for comparing the digital input signal (IN) and a signal generated in the output stage, which signal is proportional to a previous digital input signal, and for generating a digital control signal (307) for the modulator circuit (301) wherein said comparator circuit (305) comprises, a means (314) to filter a feedback signal, a means (308) to A/D convert the filtered feedback signal (304), a means (309) to add bits in the A/D-converted feedback signal, a means (310) to synchronize the A/D-converted and bit-added feedback signal with the input signal (IN), a means (311) to compare the A/D-converted, bit-added and synchronized feedback signal to the input signal (IN) in order to produce a difference signal, a means (312) to process said difference signal, and a means (313) to convert said difference signal into a suitable control signal (307) on the basis of the result of the difference signal processing.

18. A mobile station comprising an audio output stage (612) for processing a received audio signal, characterized in that the audio output stage (612) of the mobile station comprises a first means (613) to modulate a digital signal, a second means (614) to amplify a modulated signal, a third means (615) to filter a modulated and amplified signal, a fourth means (616) to generate a digital control signal (307) by comparing the input signal (IN) to a signal generated in the output stage the signal generated in the output stage being updated at a rate higher than the input signal, which signal generated in the output stage is proportional to a previous digital input signal, and by processing the signal which is the result of the comparison in such a manner that it becomes a digital control signal suitable for the first means (613).

19. The mobile station according to claim 18, characterized in that said mobile station belongs to a digital mobile communication system.

20. A method for improving a quality of an output signal of an audio output stage which comprises at least a modulator circuit, the method comprising:

comparing a signal generated in the audio output stage, which signal is proportional to a previous digital input signal, by means of feedback to the digital input signal of the audio output stage, in order to generate a digital control signal;

converting a digital output signal brought to the audio output stage into a pulse train by means of modulation;

controlling an operation of the modulator circuit by means of the digital control signal, wherein the method further comprises:

amplifying the pulse train;

filtering the pulse train in the feedback circuit to a frequency range corresponding to the input signal;

converting the filtered pulse train into a digital signal in the feedback circuit, adding bits to the digital signal so that the digital signal corresponds to the input digital word as regards the number of bits;

comparing the input digital word and the digital signal so as to produce a difference signal;

determining a change data for the digital difference signal; and on the basis of the change data the conversion of the input digital word of the output stage into a pulse train is controlled by means of a digital control signal.

21. The method according to claim 20 wherein the modulation is performed using pulse density modulation.

22. The method according to claim 20 wherein the modulation is performed using pulse width modulation.

23. A method for improving a quality of an output signal of an audio output stage which comprises at least a modulator circuit, the method comprising:

comparing, by means of feedback to a digital input signal of the audio output stage, a signal generated in the audio output stage, which signal is proportional to a previous digital input signal, the feedback taking place at a higher rate than the digital input signal;

generating a digital control signal based on the comparison; and controlling an operation of the modulator circuit by means of the digital control signal, wherein at least one reference level in the modulator circuit is changed by use of the digital control signal.

24. The method of claim 23 wherein sampling frequency of the feedback signal is higher than an updating frequency of the digital input signal.

25. The method of claim 7 further comprising updating the feedback at a higher rate than the digital input signal.

26. The method of claim 8 further comprising updating the feedback at a higher rate than the digital input signal.

27. The audio output stage of claim 17 further comprising means to update the feedback signal at a higher rate than the digital input signal.

28. The method of claim 20 further comprising a sampling rate of the feedback taking place at a higher rate than an updating frequency of the digital input signal.

* * * * *